United States Patent
Kubo

(10) Patent No.: US 6,750,908 B1
(45) Date of Patent: *Jun. 15, 2004

(54) IMAGE PROCESSING APPARATUS USING RECORDING MEDIUM WHICH NEEDS DATA ERASING PROCESSING BEFORE RECORDING OF DATA

(75) Inventor: Ryoji Kubo, Chiba-ken (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,872

(22) Filed: Dec. 19, 1997

Related U.S. Application Data

(63) Continuation of application No. 08/387,280, filed on Feb. 13, 1995, now abandoned.

(30) Foreign Application Priority Data

| Feb. 3, 1994 | (JP) | 6-032417 |
| Feb. 23, 1994 | (JP) | 6-025333 |
| Feb. 25, 1994 | (JP) | 6-027971 |
| Apr. 5, 1994 | (JP) | 6-067204 |

(51) Int. Cl.$^7$ .......................... H04N 5/80; G06F 13/00
(52) U.S. Cl. ................. 348/231.1; 348/231.2; 711/103; 713/300
(58) Field of Search .......................... 710/1, 52, 53, 710/56; 713/300, 320; 348/231.99, 213.1, 231.2, 231.7, 231.9; 358/444; 711/103, 156, 159; 365/185.04

(56) References Cited

U.S. PATENT DOCUMENTS 5,018,017 A  5/1991  Sasaki et al. ............... 348/233

(List continued on next page.)

FOREIGN PATENT DOCUMENTS

| DE | 42 20 877 A | 1/1994 |
| EP | 0 390 421 | 10/1990 |

(List continued on next page.)

OTHER PUBLICATIONS

Patent Abstracts of Japan No. JP5–233426, vol. 017, No. 692, (P–1663), Dec. 17, 1993.

(List continued on next page.)

Primary Examiner—Dung C. Dinh
(74) Attorney, Agent, or Firm—Robin, Blecker & Daley

(57) ABSTRACT

A recording system comprises a non-volatile recording medium, a recording device for recording information data on the recording medium, the recording medium including a first recording area in which to record the information data, a second recording area in which to record data indicative of an erased area in the first recording area, and a third recording area in which to record data indicative of a use status of each area in the first recording area. The recording device is operative to detect from the recording medium the data recorded in the second area and the data recorded in the third recording area, and perform erasure of, and recording of the information data in, a recording-enable and unerased area in the first recording area. A data processing apparatus comprises a detector for detecting whether a non-volatile recording medium has been attached and an erasing device for erasing information data from a predetermined area of the recording medium, less than the entire recording area, according to an output of said detecting means.

12 Claims, 15 Drawing Sheets

U.S. PATENT DOCUMENTS

| | | | |
|---|---|---|---|
| 5,153,729 A | | 10/1992 | Saito .......................... 348/232 |
| 5,210,716 A | | 5/1993 | Takada .................. 365/185.09 |
| 5,226,145 A | | 7/1993 | Moronaga et al. .......... 395/430 |
| 5,231,514 A | * | 7/1993 | Nakamura .................. 358/444 |
| 5,293,236 A | * | 3/1994 | Adachi et al. ............... 348/231 |
| 5,357,475 A | | 10/1994 | Hasbun et al. ............... 365/218 |
| 5,418,752 A | * | 5/1995 | Harari et al. ................ 365/218 |
| 5,479,633 A | | 12/1995 | Wells et al. ................. 395/430 |
| 5,530,938 A | * | 6/1996 | Akasaka et al. ............. 711/103 |
| 5,594,686 A | * | 1/1997 | Hazen et al. .......... 365/185.04 |
| 5,777,965 A | * | 7/1998 | Itami et al. .................... 369/58 |
| 5,802,551 A | * | 9/1998 | Komatsu et al. ............ 711/103 |

FOREIGN PATENT DOCUMENTS

| | | |
|---|---|---|
| EP | 0390421 | 10/1990 |
| EP | 0 422 447 | 4/1991 |
| EP | 0422447 | 4/1991 |
| EP | 0528 280 A | 2/1993 |
| EP | 0544 252 A | 6/1993 |
| EP | 0557 968 A | 9/1993 |
| JP | 59162695 | 9/1984 |
| JP | 01-217619 | 8/1989 |
| JP | 04239279 | 8/1992 |
| JP | 04-307644 | 10/1992 |
| JP | 04-336893 | 11/1992 |
| JP | 05-061760 | 3/1993 |
| JP | 05233426 | 9/1993 |
| JP | 05-258585 | 10/1993 |
| JP | 06-014229 | 1/1994 |
| JP | 06-078196 | 3/1994 |

OTHER PUBLICATIONS

Patent Abstracts of Japan No. JP4–239279, vol. 017, No. 006 (E–1302), Aug. 27, 1992.

"Increase of a Non–Volatile RAM Lifetime", IBM Technical Disclosure Bulletin, IBM Corp., New York, US, vol. 30, No. 10, Mar. 1988, p. 382.

Peter Norton, "Inside the IBM PC—Access to Advanced Features and Programming", Prentice Hall Pub. pp. 85–91.

Tetsuzo Tanigushi, et al., Solid State Disk, Oki Denshi Kenkyu Kaihatsu, Vol. 60 No. 4, Oki Electric Industry Co. Ltd., Oct. 1, 1993, No. 160, lines 11–14.

* cited by examiner

F I G. 15
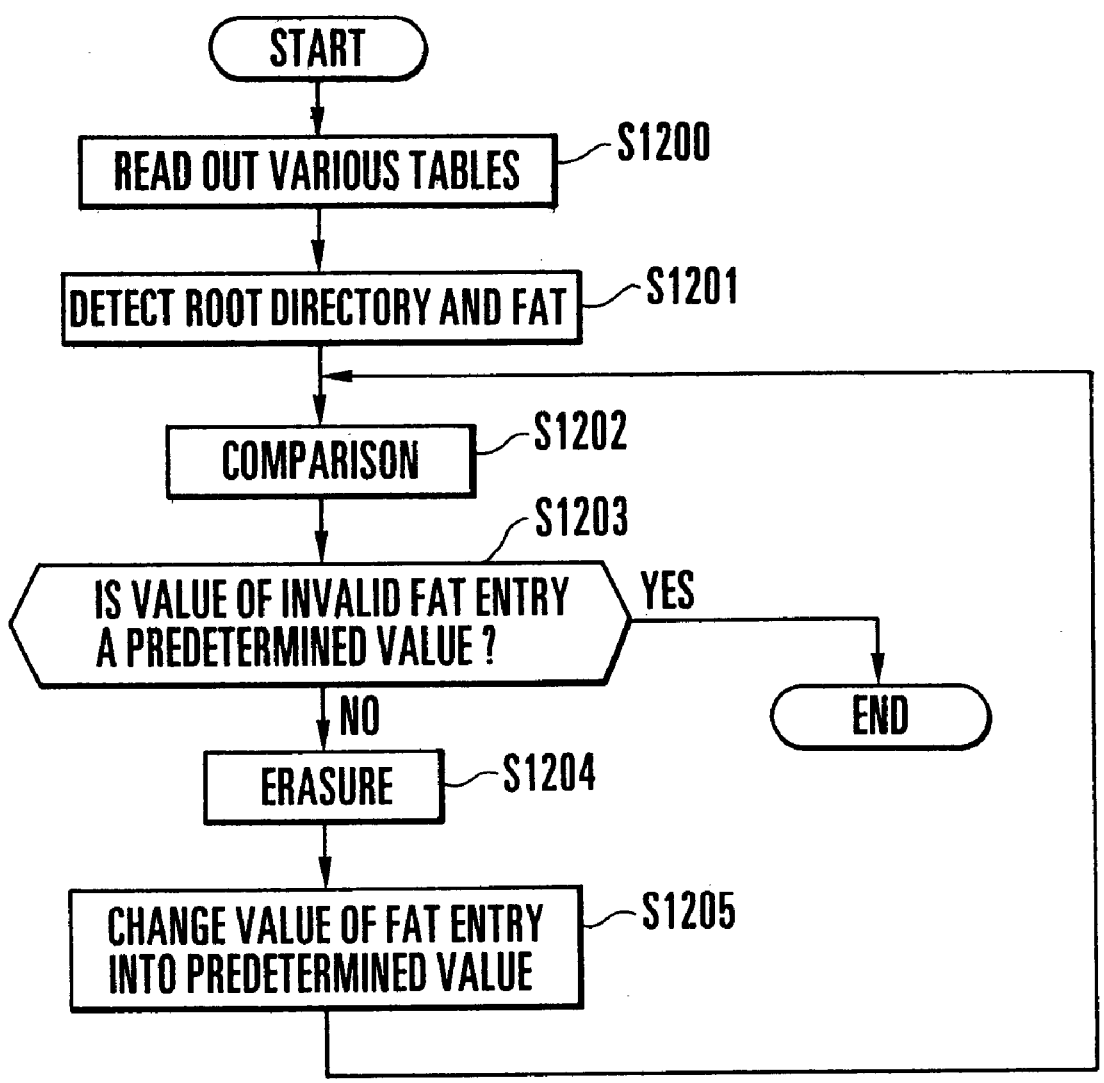

IMAGE PROCESSING APPARATUS USING RECORDING MEDIUM WHICH NEEDS DATA ERASING PROCESSING BEFORE RECORDING OF DATA

CROSS REFERENCES TO RELATED APPLICATIONS

This application is a continuation of application Ser. No. 08/387,280, filed Feb. 13, 1995, now abandoned.

BACKGROUND OF THE INVENTION

1. Field of the Invention

The present invention relates to a data processing apparatus for recording information data by using a recording medium which needs data erasing processing before recording of data.

2. Description of the Related Art

Some conventional types of commercially available electronic still cameras are capable of recording a still image by using as a recording medium a memory card having a solid-state memory element. Other types of electronic apparatus capable of using such a memory card, such as pocket-size personal organizers and portable computers, have also been commercially available.

In many cases, a flash memory which is readable, erasable and writable is used for such a memory card.

The flash memory is randomly writable, but needs a data erasing operation before recording of data. Specifically, since the flash memory has the characteristic that overwritten data is impossible to reproduce, it is necessary to record new data in an area after erasing old data recorded in that area.

The flash memory is impossible to permanently use, and has definite durability determined by the number of repetitions of a data recording/erasing operation.

To impart as long-term durability as possible to the flash memory having definite durability determined by the number of repetitions of a data recording/erasing operation, it has been proposed to adopt a recording method which includes the process of performing "erasure→recording→verification of recording" in units of a sector (512 bytes) which will be described later, i.e., the steps of erasing an area of a recording medium in which to record data before recording the data, recording the data in the erased area of the recording medium by the application of minimum recording current which enables data recording, and verifying whether the data has been securely recorded in the erased area of the recording medium.

Not only the flash memory but also an EEPROM (electrically erasable programmable read-only memory), a magneto-optical disk and the like are typical examples of the aforesaid recording medium which needs an erasing operation before recording.

For this reason, an apparatus of the type employing the recording medium which needs an erasing operation before recording, for example an electronic still camera, needs to repeatedly perform the recording operation of erasing data from a recording-enable area on the recording medium (in units of a sector), then recording image data for one photographic picture in the erased area by a maximum allowable amount which can be stored in the erased area, and then verifying the status of the recorded image data. The apparatus continues such recording operation until all the image data for one photographic picture is completely recorded on the recording medium.

The apparatus of the aforesaid type, therefore, offers the problem that a user may miss photographic timing owing to the wasteful time taken to record image data on the recording medium. This problem of recording timing takes place in not only the electronic still camera but also any type of recording apparatus employing the recording medium which needs an erasing operation before recording. In addition, it is necessary to arrange the recording apparatus so that it can quickly detect a recording-enable area on the recording medium and determine whether the recording-enable area is an erased area.

In addition, instead of the above-described recording operation which takes the wasteful time, it is also possible to adopt a method of recording data in an empty area (erased area) of the recording medium by the application of recording current which is regulated so as to permit the data to be securely recorded in a single recording cycle. This method, however, decreases the durability of the recording medium and also causes the problem that a recording-disable area occurs on the recording medium.

SUMMARY OF THE INVENTION

It is, therefore, an object of the present invention to provide an improvement in a data processing apparatus using a recording medium which needs to be subjected to an erasing operation before recording of information data, more particularly, a recording medium and a recording unit as well as a data processing apparatus which can cooperatively operate to record information data without delay.

To achieve the above object, in accordance with one aspect of the present invention, there is provided a recording medium which comprises a first recording area in which to record information data and a second recording area in which to record data indicative of a data-erased area in the first recording area.

To achieve the above object, in accordance with another aspect of the present invention, there is provided a recording unit which comprises a recording medium incapable of being overwritten and controlling means for detecting whether a predetermined area on the recording medium is a data-erased area.

To achieve the above object, in accordance with another aspect of the present invention, there is a data processing apparatus which comprises inputting means for inputting information data, recording means for recording the information data on a recording medium which needs to be subjected to an information-data erasing operation before the information data is recorded on the recording medium, erasing means for erasing unnecessary information data from the recording medium, and controlling means for executing control to cause the erasing means to erase the unnecessary information data from the recording medium while the recording means is not performing recording.

To achieve the above object, in accordance with another aspect of the present invention, there is a data processing apparatus which comprises a recording medium which needs to be subjected to an erasing operation before recording of information data, recording means for recording the information data in a predetermined area of the recording medium, detecting means for detecting whether the predetermined area of the recording medium is an erased area, erasing means for erasing information data recorded on the recording medium, and controlling means for controlling the erasing means according to an output of the detecting means.

Another object of the present invention is to provide a recording medium of improved durability and a recording unit which can record information data in a reduced time as well as a data processing apparatus using such recording medium and recording unit.

To achieve the above object, in accordance with another aspect of the present invention, there is provided a recording unit which comprises a recording medium on which to record information data, detecting means for detecting durability of the recording medium, and controlling means for controlling access to the recording medium according to an output of the detecting means.

To achieve the above object, in accordance with another aspect of the present invention, there is provided a data processing apparatus which comprises inputting means for inputting information data, access means for performing access to a recording medium to record the information data, detecting means for detecting durability of the recording medium, and controlling means for controlling the access of the access means according to an output of the detecting means.

Other objects, features and advantages of the invention will become apparent from the following detailed description taken in conjunction with the accompanying drawings.

BRIEF DESCRIPTION OF THE DRAWINGS

FIG. 15 is an explanatory flowchart of an erasure processing operation for the first memory 20 which is performed on the basis of the management data when the recording unit 7 according to the fourth embodiment is attached to the electronic still camera.

DETAILED DESCRIPTION OF THE PREFERRED EMBODIMENTS

Preferred embodiments of the present invention will be described below with reference to the accompanying drawings which show examples of an electronic still camera.

First Embodiment

Figure 1:
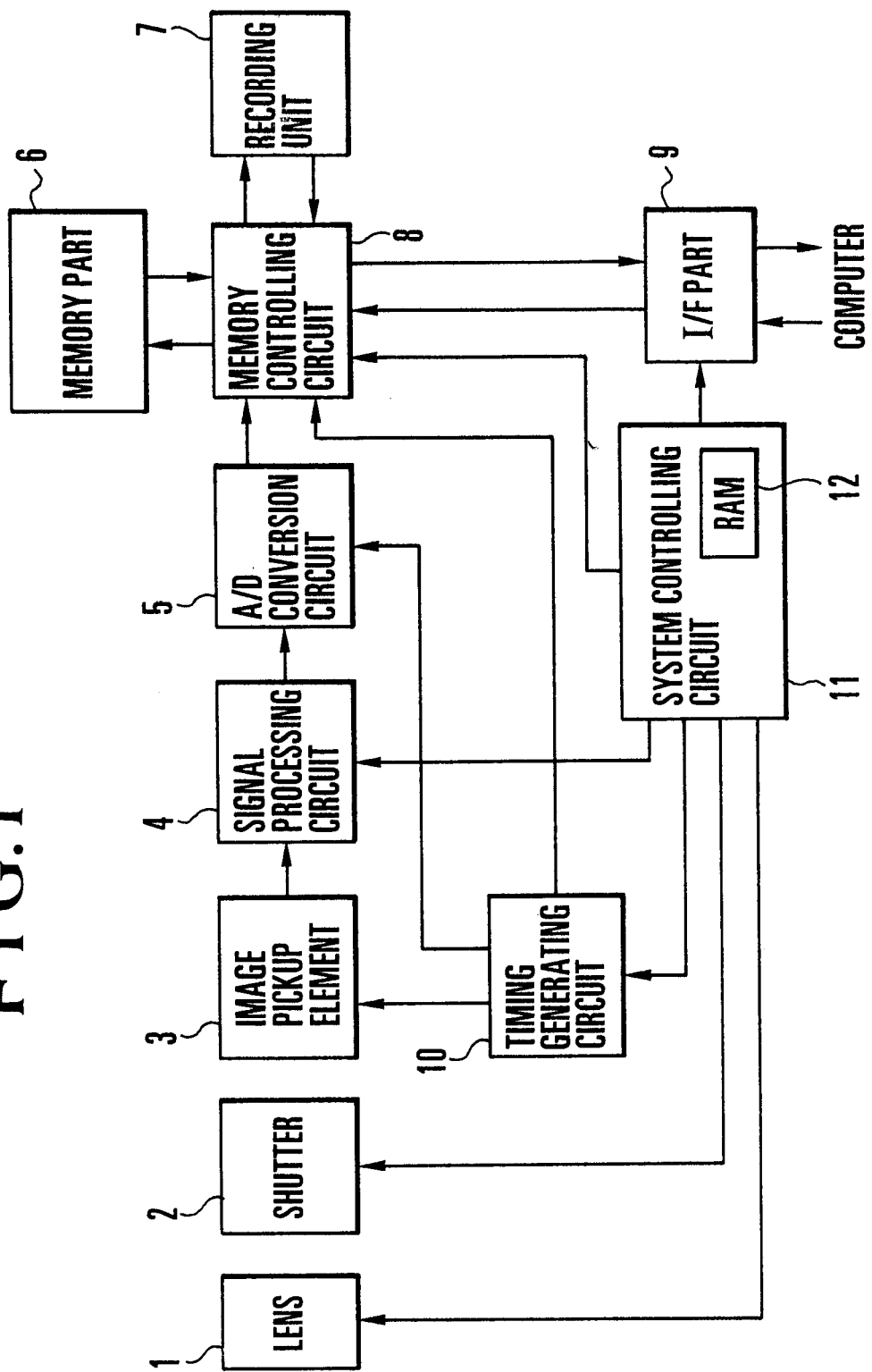
FIG. 1 is a block diagram of an electronic still camera according to a first embodiment.

FIG. 1 is a block diagram of an electronic still camera according to a first embodiment.

The electronic still camera shown in FIG. 1 includes a lens 1, a shutter 2, an image pickup element 3 such as a CCD, a signal processing circuit 4 for applying signal processing, such as various kinds of corrections and clamping, to an image signal outputted from the image pickup element 3, an A/D conversion circuit 5 for performing analog-to-digital conversion on an image signal outputted from the signal processing circuit 4, a memory part 6 for temporarily storing image data for at least one still image, a removable recording unit 7 which includes a semiconductor memory and the like on or from which to record or read out image data, a memory controlling circuit 8 for executing control of transmission of image data and control of the memory part 6, a digital I/F part 9 for transmitting image data to an external computer or the like (not shown), a timing generating circuit 10 for outputting various timing signals to the image pickup element 3, the A/D conversion circuit 5 and the recording unit 7, a system controlling circuit 11 for controlling the entire apparatus, and a RAM 12 provided in the system controlling circuit 11, for storing various data.

Figure 2:
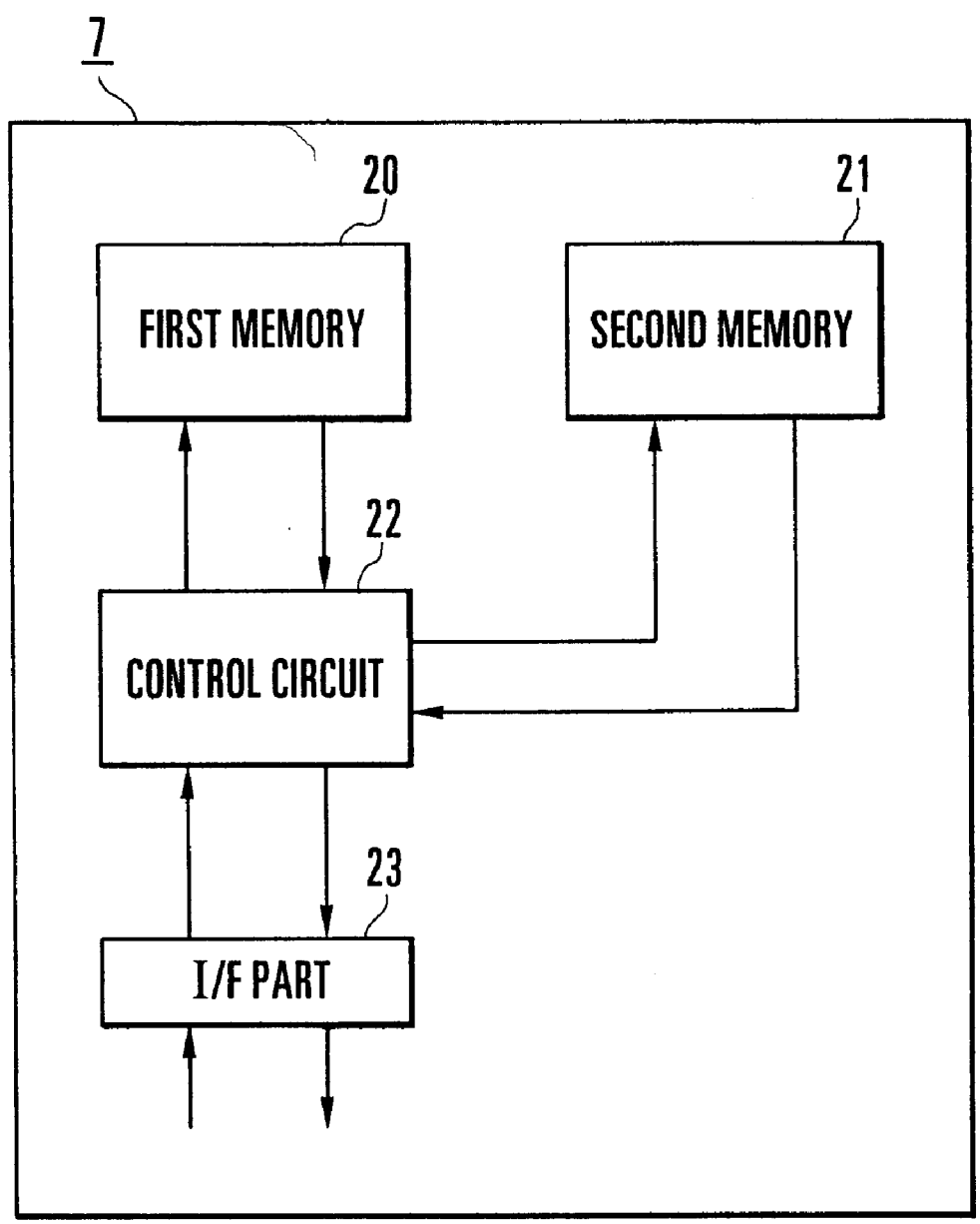
FIG. 2 is a waveform diagram of the arrangement of the recording unit 7 shown in FIG. 1.

FIG. 2 is a block diagram of the construction of the recording unit 7 shown in FIG. 1.

The recording unit 7 shown in FIG. 2 includes a first memory 20, such as a flash memory, on which to record picked-up image data, a second memory 21, such as an EEPROM, on which to record the number of accesses to the first memory 20 (in correspondence with sectors which will be described later), an I/F part 23 for performing transmission or reception of data to or from an external device, and a control circuit 22 for controlling the first memory 20, the second memory 21 and the I/F part 23.

A method for recording image data on the first memory 20 will be described below.

Figure 3:
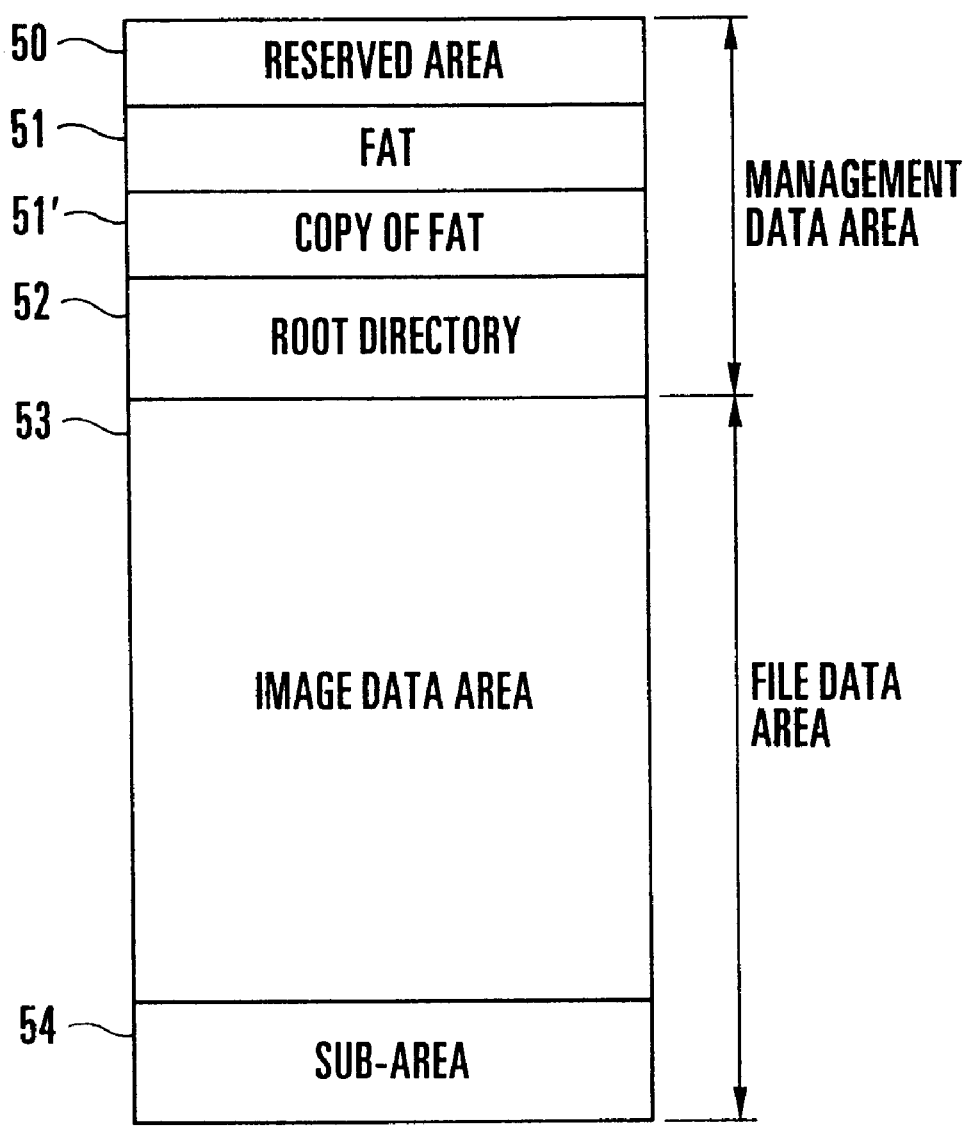
FIG. 3 is an explanatory view of a management data area and a file data area which are provided on the first memory 20 shown in FIG. 2.

FIG. 3 is an explanatory view of data areas provided on the first memory 20 shown in FIG. 2.

As shown in FIG. 3, the first memory 20 is divided into a management data area and a file data area.

The management data area has a reserved area 50 for management of files, a file allocation table (hereinafter referred to as the FAT) 51, a FAT 51 ' (copy of fat) identical to the FAT 51, and a root directory 52. The two FATs 51 and 51' are prepared for the sake of safety.

The file data area has an image data area 53 in which to record the actual data of files and a sub-area 54 in which to record an erase table.

The unit of file data of the file data area to be accessed is called "cluster", and each cluster consists of a predetermined number of contiguous sectors. The file data area is divided into clusters each having a fixed size, and the use status of a particular cluster can be detected from a corresponding FAT entry. One piece of file data consists of one or more clusters according to its data size.

The FAT 51 consists of a map for indicating the storage position of the files, i.e., in which cluster and in what order each of the files is allocated. The FAT 51 has entries corresponding to the respective clusters. If one file is not completely stored in one cluster, the entry number of the next cluster in which the file is stored is written to an entry of the FAT. If the content of a particular FAT entry is not "0", this indicates that the corresponding cluster is used.

Various kinds of file information are recorded in the root directory 52, such as file names, file sizes, the FAT entries of the leading ends of the respective files and the dates on which the respective files were created or modified last.

Since an art for managing a recording medium via a root directory and a FAT, such as the root directory 52 and the FAT 51, is a known art, a more detailed description is omitted herein.

The erase table which constitutes one feature of the present invention will be described below.

The erase table consists of a map for indicating the status of erasure of each of the clusters, and has entries corresponding to the respective clusters similarly to the FAT 51 described above. If a cluster corresponding to a particular entry is already erased, a bit "1" is assigned to this entry; otherwise, a bit "0" is assigned to the entry. As described previously, the erase table is recorded in the sub-area 54 provided in the file data area. Although in the present embodiment one bit is assigned to each entry of the erase table by way of example, a plurality of bits may be assigned to each entry.

The photographic operation of the electronic still camera arranged in the above-described manner will be described below with reference to the flowchart of FIG. 4.

Figure 4:
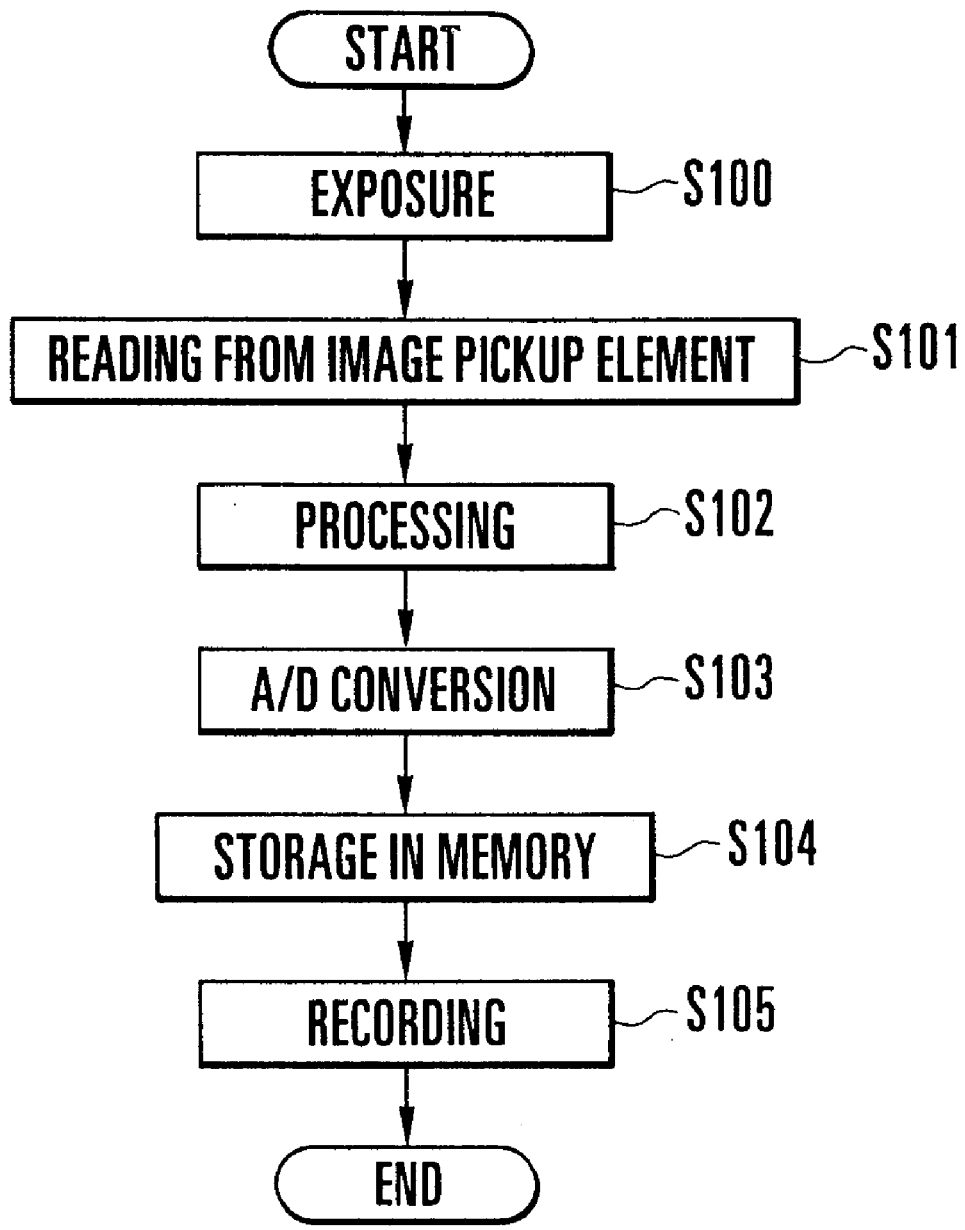
FIG. 4 is an explanatory flowchart of the processing operation of the electronic still camera according to the first embodiment which is performed from the start of photography until the end of recording.

FIG. 4 is an explanatory flowchart of the processing operation of the electronic still camera according to the first embodiment which is performed from the start of photography until the end of recording.

If a recording instruction is inputted to the system controlling circuit 11 through an operating switch (not shown) or the like, the flow starts.

In Step S100, the shutter 2 is driven to execute exposure. Then, in Step S101, an image signal is read from the image pickup element 3, and the process proceeds to Step S102.

In Step S102, the read image signal is subjected to color correction and predetermined processing in the signal processing circuit 4.

Then, in Step S103, the image signal processed by the signal processing circuit 4 is converted from analog to digital by the A/D conversion circuit 5.

In Step S104, the image signal converted from analog to digital in Step S103 is stored in the memory part 6 via the memory controlling circuit 8.

Then, in Step S105, the image data stored in the memory part 6 is recorded into the recording unit 7 via the memory controlling circuit 8.

The memory controlling circuit 8 has a compression circuit for compressing the digital image data outputted from the A/D conversion circuit 5.

Figure 16:
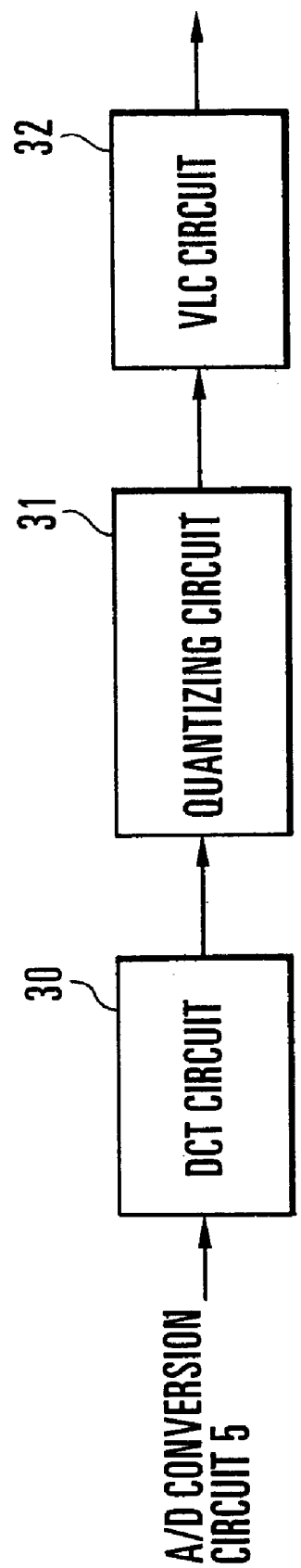
FIG. 16 is a block diagram of a compression circuit.

FIG. 16 is a block diagram of the compression circuit.

The digital image signal outputted from the A/D conversion circuit 5 is inputted to a DCT (discrete cosine transform) circuit 30 and DCT-converted into image data for each block made up of a plurality of pixels. The image data is quantized for each block by a quantizing circuit 31. The quantized image data is coded into a variable-length code by a variable-length coding (VLC) circuit 32.

The quantizing step of the quantizing circuit 31 is controlled by the system controlling circuit 11, whereby the amount of data for variable-length coding can be adjusted.

The data recording and erasing operations of the recording unit 7 will be described below.

Figure 5:
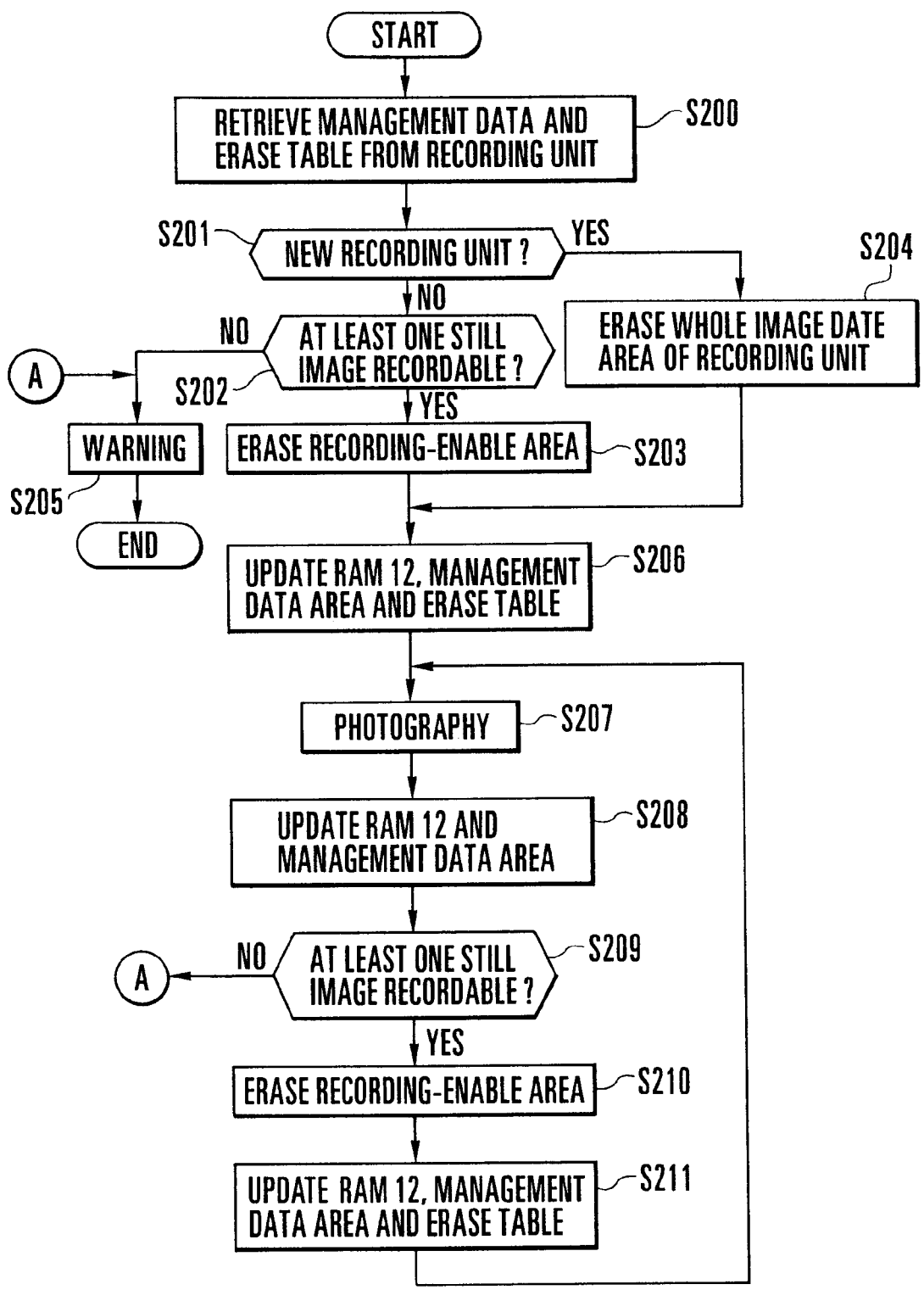
FIG. 5 is an explanatory flowchart of the data recording and erasing operations of the recording unit 7 shown in FIG. 1.

FIG. 5 is an explanatory flowchart of the data recording and erasing operations of the recording unit 7.

If the recording unit 7 is attached to the body of the electronic still camera or the power source of the electronic still camera is turned on with the recording unit 7 attached thereto, the flow shown in FIG. 5 starts. Whether the recording unit 7 has been attached is detected via the detection of the switching operation of a switch (not shown) which is turned on or off according to the attachment or removal of the recording unit 7. Such switch may be provided on the electronic still camera. It is also possible to adopt an arrangement capable of detecting the attachment of the recording unit 7 through communications between the electronic still camera and the recording unit 7.

In Step S200, retrieval is performed of the management data recorded in the management data area of the first memory 20 of the attached recording unit 7, and retrieval from the erase table recorded in the sub-area 54 is also performed. The recording status of the image data area 53, i.e., the presence or absence of a recorded area, an erased unrecorded area and a recording-enable area, is stored in the RAM 12 provided in the system controlling circuit 11.

The erased unrecorded area is an area in the first memory 20 from which image data (recorded in a particular area) is physically erased. The recording-enable area is an area from which image data is logically erased, i.e., an area in which previous image data remains because no physical erasure is executed.

In Step S201, on the basis of the result of the retrieval from the management data area, it is determined whether the attached recording unit 7 is a recording unit which is unrecorded over all areas, i.e., which is not yet used.

If the attached recording unit 7 is a recording unit which is not yet used, the process proceeds to Step S204, whereas if it is not a recording unit which is not yet used, the process proceeds to Step S202.

In Step S204, erasure of the whole image data area 53 of the recording unit 7 is performed. Then, the process proceeds to Step S206.

In Step S202, it is determined whether the attached recording unit 7 has a sufficient capacity to record at least one still image.

If it is determined that the attached recording unit 7 has a sufficient capacity to record at least one still image, the process proceeds to Step S203, whereas if the attached recording unit 7 does not have a sufficient capacity to record at least one still image, the process proceeds to Step S205.

In Step S205, a warning is displayed for a predetermined period of time in order to inform a photographer that recording is impossible and that the attached recording unit 7 needs to be replaced with a new one. Then, the flow is brought to an end.

In Step S203, physical erasure of the recording-enable area (logically erased area) is performed. The physical-erasure unit of the recording-enable area is selected so that a predetermined recording capacity can be obtained by adding the unrecorded area to the recording-enable area to be presently physically erased. Then, the process proceeds to Step S206. This erasure operation will be described later in more detail.

The predetermined recording capacity corresponds to, for example, the memory capacity of the memory part 6 itself, a memory capacity for a maximum number of still images which can be stored in the memory part 6, a preset memory capacity, or a memory capacity for a preset number of still images. If necessary, all the recording-enable areas may also be physically erased. If the recording unit 7 does not have a sufficient recording capacity to ensure the predetermined memory capacity, physical erasure for such sufficient recording capacity may be performed. This physical erasure is automatically executed when a predetermined time period elapses after the recording unit 7 has been attached to the electronic still camera or after the power source has been turned on. If no physical erasure is needed (for example if there is no recording-enable area), physical erasure, of course, is not executed.

In Step S206, the RAM 12 and the management data area as well as the erase table provided on the first memory 20 of the recording unit 7 are updated according to the result of the physical erasure of the recording-enable area.

If a recording instruction is inputted to the system controlling circuit 11 through the operating switch (not shown) or the like, the process proceeds to Step S207. In Step S207, a photographic operation is performed and the image data obtained through the photographic operation is temporarily stored in the memory part 6. After that, the image data is recorded in a (physically erased) unrecorded area of the image data area 53 on the first memory 20 of the recording unit 7.

In Step S208, after the photographic operation and the recording operation have been completed, the RAM 12 and the management data in the management data area of the recording unit 7 are updated according to the result of the photographic and recording operations. The recording operation will be described later in more detail.

In Step S209, the recording status of the image data area 53 which is stored in the RAM 12 is retrieved, and it is determined whether at least one still image can be recorded in the recording unit 7.

If it is determined that at least one still image can be recorded in the recording unit 7, the process proceeds to Step S210, whereas if it is impossible to record at least one still image, the process proceeds to Step S205 described previously.

In Step S210, physical erasure of the recording-enable area (logically erased area) is performed. The physical-erasure unit of the recording-enable area is selected so that a predetermined recording capacity can be obtained by adding the unrecorded area to the recording-enable area to be presently physically erased. Then, the process proceeds to Step S211.

The predetermined recording capacity corresponds to, for example, the memory capacity of the memory part 6 itself, the memory capacity for the maximum number of still images which can be stored in the memory part 6, the preset memory capacity, or the memory capacity for the preset number of still images. If necessary, all the recording-enable areas may also be physically erased. If the recording unit 7 does not have a sufficient recording capacity to ensure the predetermined memory capacity, physical erasure for such sufficient recording capacity may be performed. If the pre-determined memory capacity can be obtained without physically erasing the recording-enable area, a physical erasure operation, of course, is not needed. This physical erasure is automatically executed if no operating instruction is inputted for a predetermined time period after the completion of the photographic operation.

In Step S211, the RAM 12 and the management data stored in the management data area as well as the erase table provided on the recording unit 7 are updated according to the result of the physical erasure of the recording-enable area. Then, the process returns to Step S207.

A processing operation, which is executed when a recording instruction is inputted through the switch (not shown) or the like during the erasure of data from the first memory 20 (for example, during the execution of Step S203, S204 or S210), will be described below with reference to the flowchart of FIG. 6.

Figure 6:
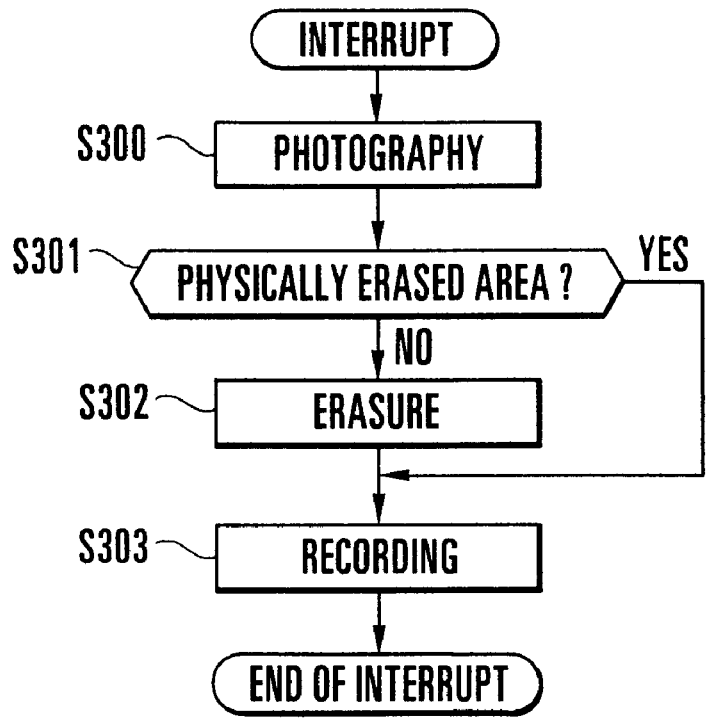
FIG. 6 is an explanatory flowchart showing a processing operation which is executed when a photographing instruction is inputted during data erasure.

FIG. 6 is an explanatory flowchart showing the processing operation which is executed when a photographing instruction is inputted during data erasure.

Referring to FIG. 6, if a recording instruction is inputted during the erasure of the recording unit 7, the flow starts.

In Step S300, the erasing operation is temporarily stopped, and a photographic operation is performed and the obtained image data is stored in the memory part 6.

Then, in Step S301, it is determined whether a sufficient recording area to record image data for at least one still image (a physically erased area) is present in the recording unit 7.

If a physically erased area is not present in the recording unit 7, the process proceeds to Step S302, whereas if a physically erased area is present, the process proceeds to Step S303.

In Step S302, the processing of physically erasing a recording-enable area of the recording unit 7 is performed.

In Step S303, the image data is read from the memory part 6 and recorded in the physically erased area.

A far better operability can be achieved by performing different data-erasing operations for the recording unit 7 in three cases which will be described below.

Case 1: An instruction to erase required image data is inputted through the switch (not shown) or the like.

If an instruction to erase required image data is inputted through the switch (not shown) or the like, a FAT and a root directory are erased (logical erasure) according to clusters corresponding to the required image data. Thus, this image data area is changed into a recording-enable area.

However, the image data is not actually erased.

Then, the system controlling circuit 11 starts time counting after the completion of the aforesaid logical erasing operation and, when a predetermined time period elapses, automatically erases the image data remaining in the recording-enable area (physical erasure).

Of course, when the logical erasure and the physical erasure are performed, the RAM 12 and the erase table in the recording unit 7 are updated.

Case 2: The apparatus operates with a battery power source.

If the voltage of the battery power source is not lower than a predetermined voltage, erasure (physical erasure) of the recording unit 7 is performed for ensuring an unrecorded area for the aforesaid predetermined capacity. If the voltage of the battery power source is lower than the predetermined voltage, erasure for a capacity smaller than the predetermined capacity is performed. In other words, the capacity of an unrecorded area to be ensured in the recording unit 7 is changed according to the voltage of the battery power source.

Case 3: Image data is compressed at different compression ratios.

The capacity of an unrecorded area to be ensured in the recording unit 7 is changed according to a selected compression ratio.

Data management which is involved in the recording of image data in the recording unit 7 will be described below in detail with reference to the flowchart of FIG. 7.

Figure 7:
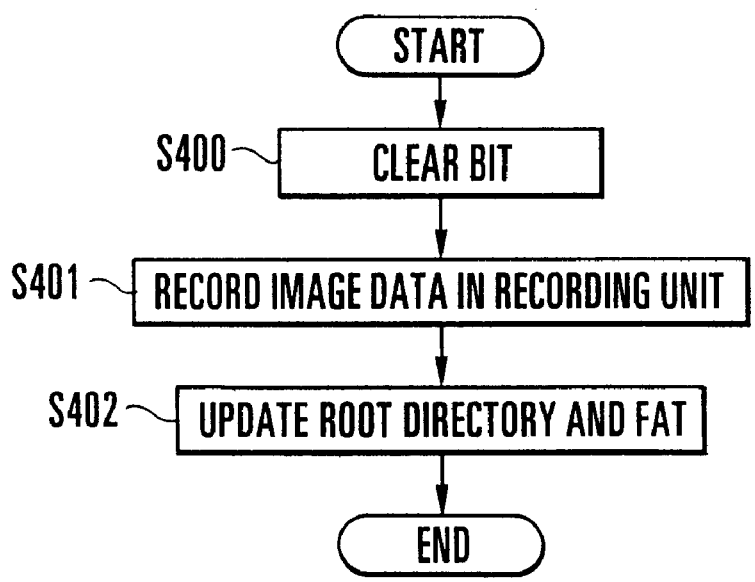
FIG. 7 is an explanatory flowchart of the processing of updating management data according to the recording of image data.

FIG. 7 is an explanatory flowchart of the processing of updating management data according to the recording of image data.

If a recording instruction is inputted, the flow starts.

In Step S400, "0s" are respectively assigned to entries of the erase table which correspond to a series of clusters in which to record image data.

Then, in Step S401, the image data stored in the memory part 6 are recorded, via the memory controlling circuit 8, in the series of clusters which respectively correspond to the entries assigned "0s" of the erase table in the file data area of the recording unit 7.

In Step S402, a new root directory is created and the FATs 51 and 51' of the management data area are updated on the basis of the series of clusters corresponding to the respective entries of the erase table which are assigned "0s". Thus, the process is brought to an end.

The erasing operation which is performed on the basis of the management data when the recording unit 7 is attached to the electronic still camera according to the present embodiment will be described below in detail with reference to the flowchart of FIG. 8.

Figure 8:
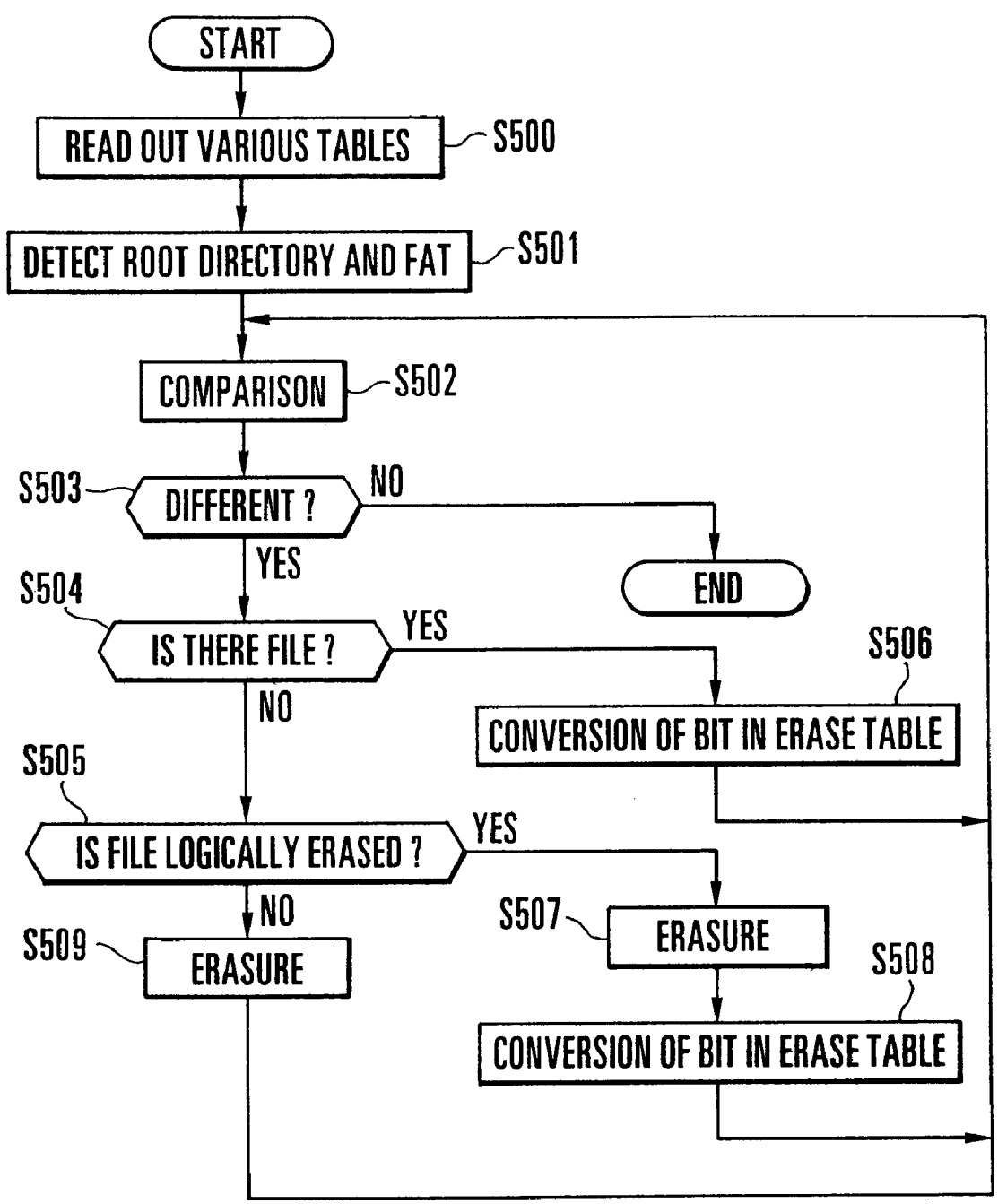
FIG. 8 is a flowchart showing the processing operation of erasing data from the first memory 20 on the basis of the management data when the recording unit 7 is attached to the electronic still camera.

FIG. 8 is a flowchart showing the processing operation of erasing data from the first memory 20 on the basis of the management data when the recording unit 7 is attached to the electronic still camera.

If the recording unit 7 is attached to the body of the electronic still camera, the flow starts. Whether the recording unit 7 has been attached is detected via the detection of the switching operation of the switch (not shown) which is turned on or off according to the attachment or removal of the recording unit 7. Such switch may be provided on the electronic still camera. It is also possible to adopt an arrangement capable of detecting the attachment of the recording unit 7 through communication between the electronic still camera and the recording unit 7.

In Step S500, the erase table is read from the sub-area 54 of the first memory 20 of the recording unit 7, while the root directory 52 and the FAT 51 are read from the management data area of the first memory 20 of the recording unit 7 (refer to FIG. 3). The readout results are stored in the memory part 6 or the RAM 12 of the system controlling circuit 11.

In Step S501, the correspondence between the root directory 52 and the FAT 51 is detected. From the detected correspondence, it is determined which clusters are recording-enable clusters.

In Step S502, the use (recording) status of the clusters detected in Step S501 is compared with the erase table.

If it is determined in Step S503 that the erase table and the correspondence (the use (recording) status of the clusters) detected in Step S501 are equal, the initialization of the recording unit 7 is brought to an end. If they differ, the process proceeds to Step S504.

Incidentally, if the erase table and the correspondence (the use (recording) status of the clusters) detected in Step S501 are equal, all the recording-enable clusters obtained from the detection processing of Step S501 coincide with clusters corresponding to the respective entries assigned "1s" on the erase table, or all the recording-disable clusters obtained from the detection processing of Step S501 coincide with clusters corresponding to the respective entries assigned "0s" on the erase table.

In Step S504, it is determined whether clusters which constitute part or the whole of a file detected by the processing of Step S501 are found among the clusters corresponding to the entries assigned "1s" on the erase table.

If it is determined that such clusters are found (for example, a file is created by another data recording apparatus), the process proceeds to Step S506, in which bits assigned to the respective entries on the erase table which correspond to the clusters are converted into "0s", respectively. Then, the process returns to Step S502.

If it is determined in Step S504 that there are no such clusters, the process proceeds to Step S505.

In Step S505, it is determined whether clusters which constitute part or the whole of the file detected by the processing of Step S501 and whose respective FAT entries are erased (deleted) or absent (whose FAT entries are assigned "0s", respectively) are found among the clusters corresponding to the entries assigned "0s" on the erase table.

If it is determined that such clusters are found (for example, a file may be deleted by another data recording apparatus), the process proceeds to Step S507, in which the root directory and the FAT are erased according to the clusters and the clusters themselves are also erased. Then, the process proceeds to Step S508, in which bits assigned to entries on the erase table which correspond to the respective clusters are converted into "1s", respectively. Then, the process returns to Step S502.

If it is determined in Step S505 that there are no such clusters, this indicates that FAT entries which constitute part or the whole of a file which has not been detected by the processing of Step S501 are found among the clusters corresponding to the entries assigned "1s" on the erase table (for example, a file, after created, is deleted by another data recording apparatus).

In this case, the process proceeds to Step S509, in which the directories of the root directory and FAT entries corresponding to the clusters as well as the clusters themselves are erased. Then, the process returns to Step S502.

The phrase "erasure of the directories of the root directory and FAT entries" and other similar expressions which are used in the above description of the flowcharts indicate that a predetermined value, such as "0", is recorded on at least one of the root directory and the FAT. The phrase "erasure of clusters" indicates that all data in a predetermined area of the first memory 20 are fixed to "1" or "0", i.e., the predetermined area of the first memory 20 is physically erased.

If desired data is already erased or there is a particular area which does not need to be erased, the aforesaid erasure, of course, is not needed.

In addition, although in the present embodiment the erase table is recorded in the area (the sub-area 54 shown in FIG. 3) of the file data area that is not placed under management of the management data area, the erase table may be recorded as a normal file.

A recording operation for recording image data in the recording unit 7 (in consideration of the durability of a recording medium) according to another embodiment will be described below in detail.

The embodiment which will be described below has a first recording mode for effecting data recording by automatically performing the process of "erasure→recording→verification of recording" in a manner similar to the conventional one and a second recording mode for completing data recording once by the application of a large recording current as well as an erasure mode for preparing an erased area in the recording unit 7 before execution of the second recording mode.

Figure 9:
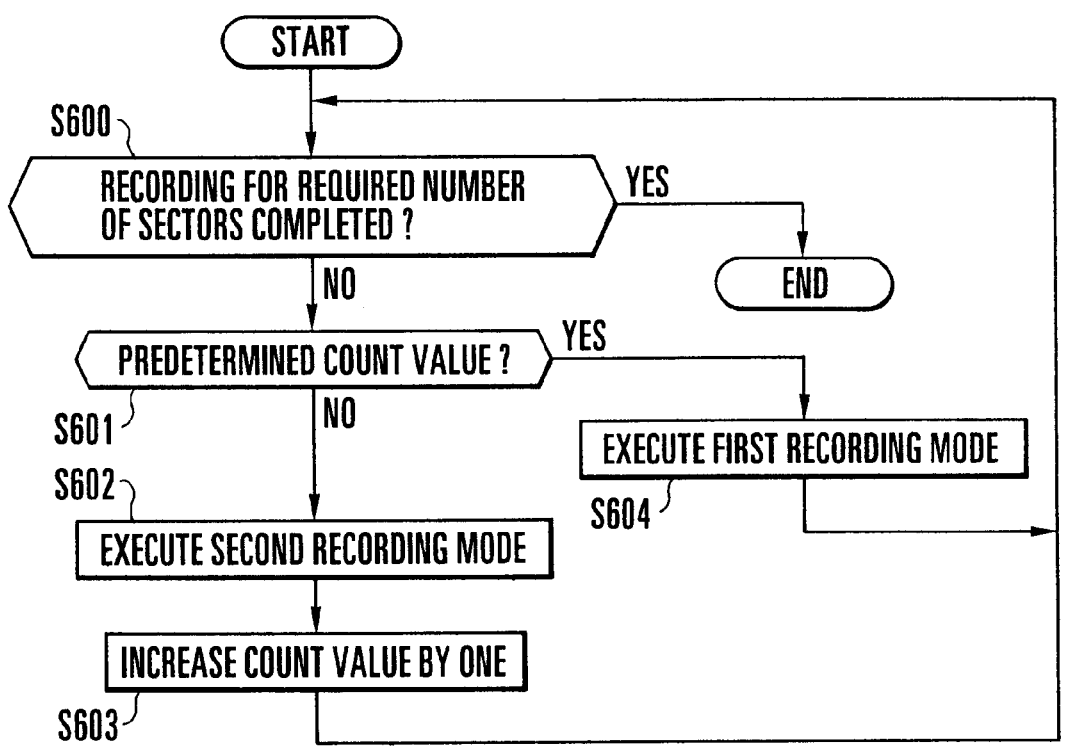
FIG. 9 is an explanatory flowchart showing a recording operation for recording image data in the recording unit 7.

FIG. 9 is an explanatory flowchart showing the recording operation for recording image data in the recording unit 7.

In the flowchart shown in FIG. 9, if a recording instruction based on the second recording mode is outputted from the system controlling circuit 11, it is determined in Step S600 whether recording for a required number of sectors has been completed, i.e., it is determined whether recording for all the sectors required for the amount of data to be recorded has been completed.

If such recording has been completed, the flow is brought to an end.

If such recording has not yet been completed, the process proceeds to Step S601.

In Step S601, the control circuit 22 of the recording unit 7 refers to a count value stored in the second memory 21, which count value corresponds to a particular sector on which particular data is to be recorded and which is one of the predetermined number of sectors in the first memory 20. The control circuit 22 determines whether such count value is not less than a predetermined value.

If it is determined that the count value is less than the predetermined value, the process proceeds to Step S602. In Step S602, the data inputted via the I/F part 23 and the control circuit 22 is recorded on the particular sector in the first memory 20 in the second recording mode, and the process proceeds to Step S603.

In Step S603, the count value in the second memory 21 which corresponds to the particular sector on which the data has just been recorded is increased by one. Then, the process returns to Step S600.

If it is determined in Step S601 that the count value is not less than the predetermined value, the process proceeds to Step S604, in which the data inputted via the I/F part 23 and the control circuit 22 is recorded on the particular sector in the first memory 20 in the first recording mode. Then, the process returns to Step S600.

Incidentally, if the predetermined number of sectors required for recording data in the first recording mode are already erased or do not need to be erased, erasure, of course, is not needed.

An erasing operation (which allows for the durability of a recording medium) for erasing image data recorded in the recording unit 7 according to the present embodiment will be described below in detail.

Figure 10:
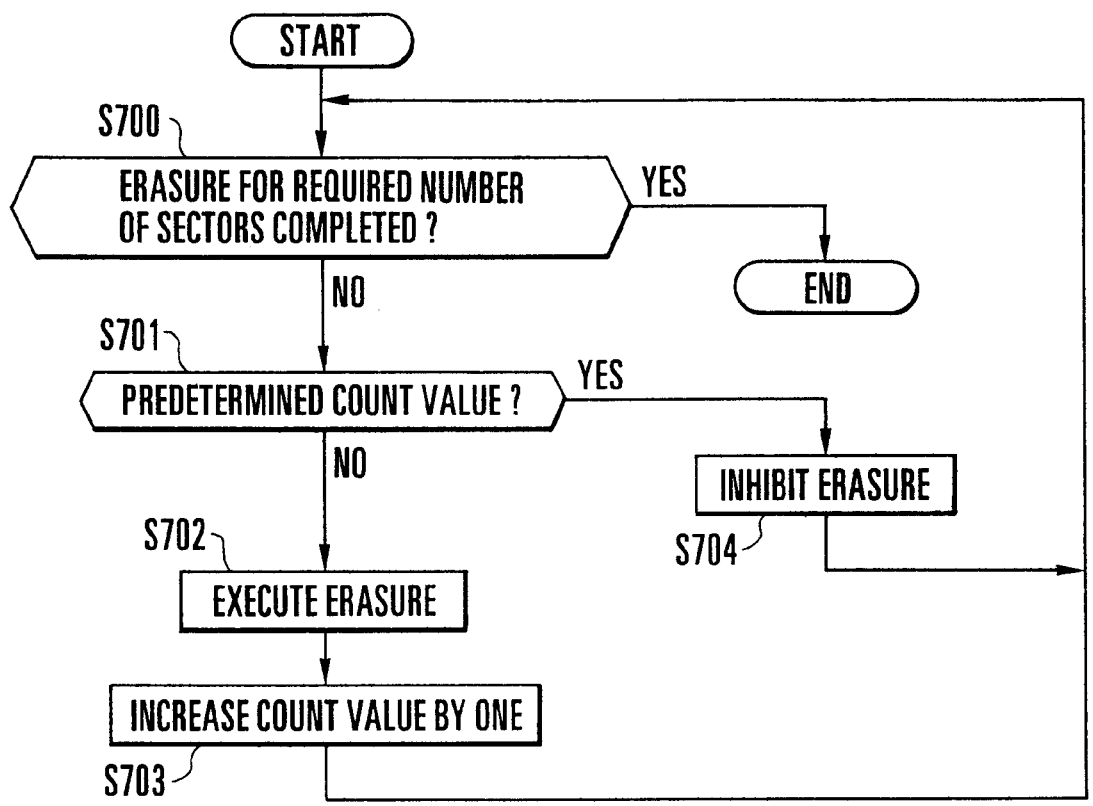
FIG. 10 is an explanatory flowchart of an erasing operation for erasing image data recorded in the recording unit 7.

FIG. 10 is an explanatory flowchart of the erasing operation for erasing image data recorded in the recording unit 7.

If an erasure instruction based on the erasure mode is outputted from the system controlling circuit 11, the flow starts.

In Step S700, it is determined whether erasure for a required number of sectors has been completed, i.e., it is determined whether a plurality of sectors to be erased have been completely erased.

If such erasure has been completed, the flow is brought to an end.

If such erasure has not been completed, the process proceeds to Step S701, in which the control circuit 22 of the recording unit 7 refers to a count value stored in the second memory 21, which count value corresponds to a particular sector to be erased which is one of the predetermined number of sectors in the first memory 20. The control circuit 22 determines whether such count value is not less than a predetermined value.

If it is determined that the count value is less than the predetermined value, the process proceeds to Step S702. In Step S702, the erasure mode is executed to erase the particular sector in the first memory 20, and the process proceeds to Step S703.

In Step S703, the count value in the second memory 21 which corresponds to the particular sector which has just been erased is increased by one. Then, the process returns to Step S700.

If it is determined in Step S701 that the count value is not less than the predetermined value, the process proceeds to Step S704, in which erasure of the particular sector in the first memory 20 is inhibited. Then, the process returns to Step S700.

Incidentally, even during erasure, if a particular sector is already erased or there is a sector which does not need to be erased, erasure, of course, is not needed. Accordingly, the count value is not increased.

In the operation of the above-described embodiment, during recording or erasure for a predetermined number of sectors, each time recording for one sector is executed in the second recording mode or erasure for one sector is executed in the erasure mode, the count value in the second memory 21 is increased by one in Step S603 (refer to FIG. 9) or in Step S703 (refer to FIG. 10). However, the following operations may be adopted.

(1) The count value is increased by one each time either one of one access in the second recording mode and one access in the erasure mode is performed.

(2) Weighted counting is performed in such a manner that the count value is increased by one for one access in the first recording mode, by ten for one access in the second recording mode, or by ten for one access in the erasure mode.

Also, a plurality of processing operations corresponding to different count values may be prepared. For example, control may be performed so that, if the count value is greater than the predetermined value in Step S601, recording for the corresponding sector is inhibited.

In the present embodiment, the recording unit 7 is provided with the second memory 21 for recording the number of accesses to the first memory 20, independently of the first memory 20 for recording image data. However, if an area for recording the number of accesses is provided in the first memory 20, there is no need to provide the second memory 21.

Second Embodiment

Although, in the first embodiment, access to the erase table is performed by the system controlling circuit 11 provided in the electronic still camera, such access is, in the second embodiment, performed by the control circuit 22 (refer to FIG. 2) provided in the recording unit 7.

The control circuit 22 operates to update the erase table each time the system controlling circuit 11 accesses a FAT entry.

Specifically, if data is recorded in the recording unit 7, "0s" are respectively assigned to entries of the erase table which correspond to a series of clusters. If data is deleted, no bit is updated. If data is erased, "1s" (indicative of "erased") are respectively assigned to entries of the erase table which correspond to a series of clusters.

The description of the other operations, which are identical to those of the first embodiment, is omitted.

The term "erasure" and other similar expressions indicate that all data in a predetermined area of the recording unit 7 are fixed to "1" or "0", i.e., the predetermined area of the recording unit 7 is physically erased.

An operation which is performed when the recording unit 7 having the control circuit 22 for performing the above-described processing is attached to the electronic still camera will be described below with reference to the flowchart of FIG. 11.

Figure 11:
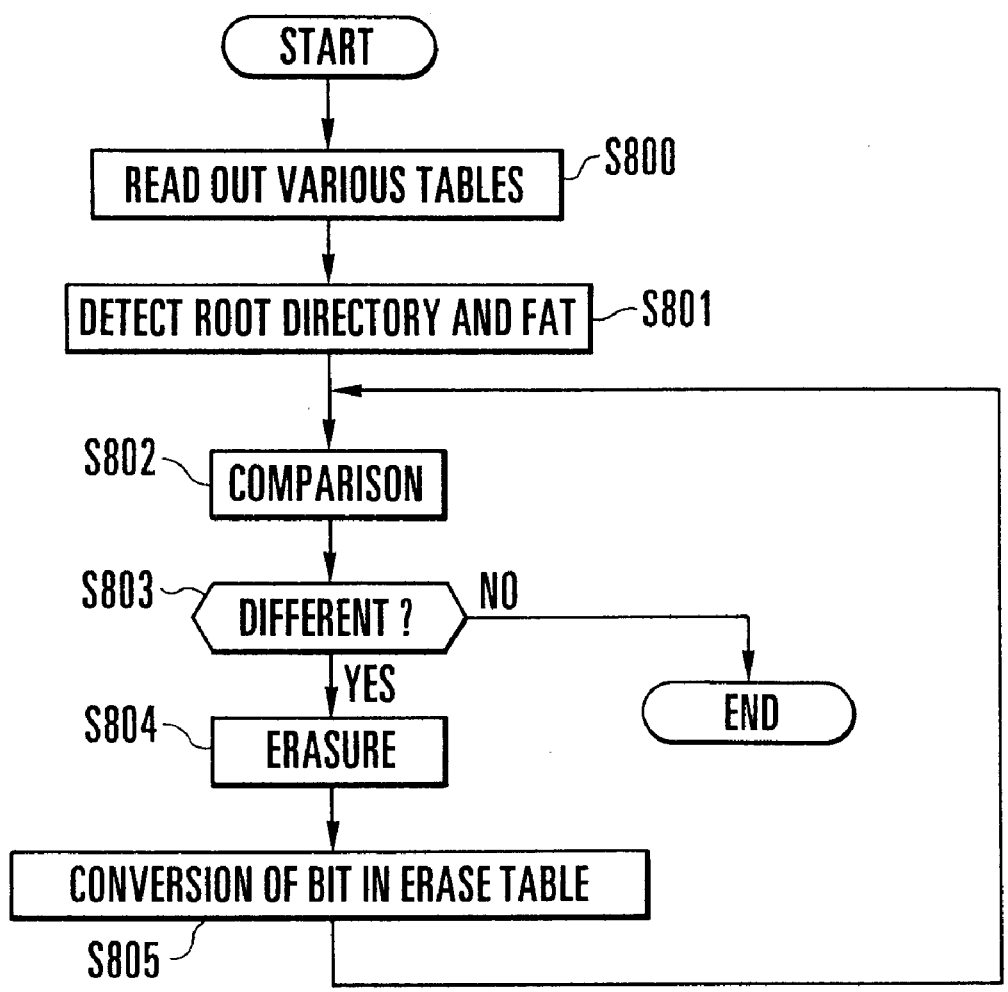
FIG. 11 is an explanatory flowchart of an erasure processing operation for the first memory 20 which is performed on the basis of the management data when the recording unit 7 according to a second embodiment is attached to the electronic still camera.

FIG. 11 is an explanatory flowchart of a processing operation for the first memory 20 which is performed when the recording unit 7 according to the second embodiment is attached to the electronic still camera.

If the recording unit 7 is attached to the body of the electronic still camera, the flow starts. Whether the recording unit 7 has been attached is detected via the detection of the switching operation of the switch (not shown) which is turned on or off according to the attachment or removal of the recording unit 7. Such switch may be provided on the electronic still camera. It is also possible to adopt an arrangement capable of detecting the attachment of the recording unit 7 through communications between the electronic still camera and the recording unit 7.

In Step S800, the erase table is read from the sub-area 54 of the first memory 20, while the root directory and the FAT (refer to FIG. 3) are read from the management data area of the first memory 20.

The readout results are stored in a RAM (not shown) of the control circuit 22.

In Step S801, the correspondence between the root directory 52 and the FAT 51 is detected. From the detected correspondence, it is determined which clusters are recording-enable clusters.

In Step S802, the use (recording) status of the clusters detected in Step S801 is compared with the erase table.

If it is determined in Step S803 that the erase table and the correspondence (the use (recording) status of the clusters) detected in Step S801 are equal, the initialization of the first memory 20 is brought to an end. If they differ, the process proceeds to Step S804.

Incidentally, if the erase table and the correspondence (the use (recording) status of the clusters) detected in Step S801 are equal, all the recording-enable clusters obtained from the detection processing of Step S801 coincide with clusters corresponding to the respective entries assigned "1s" on the erase table, or all the recording-disable clusters obtained from the detection processing of Step S801 coincide with clusters corresponding to the respective entries assigned "0s" on the erase table.

In Step S804, the recording-enable clusters are erased which have been detected via the processing of Step S801 from among the clusters corresponding to the entries assigned "0s" on the erase table, and the root directory and the FAT are also erased according to the clusters. Then, the process proceeds to Step S805, in which bits assigned to the respective entries on the erase table which correspond to the erased clusters are converted into "1s", respectively. Then, the process returns to Step S802.

Incidentally, in the second embodiment, it is also possible to adopt an arrangement in which information for the erase table is recorded and held not in the first memory 20 but in the control circuit 22.

Each of the above-described embodiments is arranged in such a manner that the processing of erasing data from recording-disable areas of the recording unit 7 (physical erasure) is executed when the recording unit 7 is attached to the electronic still camera. However, it is also possible to adopt another arrangement in which, before the recording of data on a recording medium, it is determined whether an area in which to record data is a data-erased area, via the processing method described above in connection with the attachment of the recording unit 7. If it is determined that such area is an area which needs to be erased, erasure of the area is performed and the recording of the data is then performed. Unlike the first embodiment, in the second embodiment, the electronic still camera does not need to output an erasing instruction, and erasure processing can be automatically performed by the control circuit 22 provided in the recording unit 7.

The other processing is similar to that of the first embodiment.

Third Embodiment

The construction of an electronic still camera according to the third embodiment is identical to that shown in FIG. 1 which is described previously in connection with the first embodiment, and the description thereof is omitted.

The third embodiment differs from the first embodiment in respect of a method for recording image data in the recording unit 7.

In the third embodiment, a second FAT having an arrangement identical to that of the FAT 51 is recorded in the sub-area 54 which is used in the first embodiment (refer to FIG. 3) for the purpose of recording the erase table.

A photographic operation of the electronic still camera arranged in the above-described manner will be described below with reference to the flowchart of FIG. 12.

Figure 12:
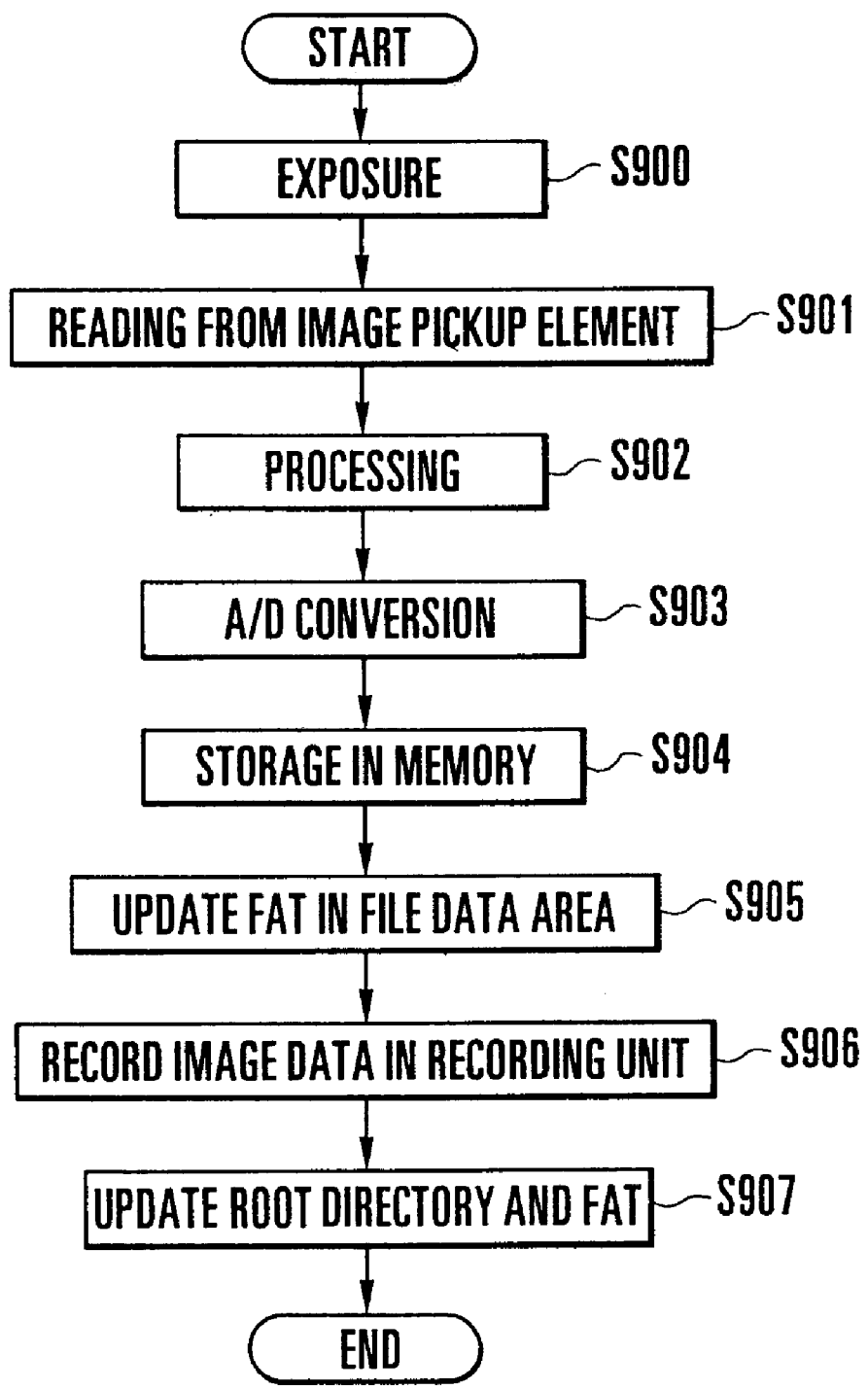
FIG. 12 is an explanatory flowchart of a photographic operation of a third embodiment.

FIG. 12 is an explanatory flowchart of a processing operation which is performed from the start of photography until the end of recording by the electronic still camera arranged to record image data on the first memory 20 having the above-described recording area.

If a recording instruction is inputted to the system controlling circuit 11 through the operating switch (not shown) or the like, the flow starts.

In Step S900, the shutter 2 is driven to execute exposure. Then, in Step S901, an image signal is read from the image pickup element 3, and the process proceeds to Step S902.

In Step S902, the read image signal is subjected to color correction and predetermined processing in the signal processing circuit 4.

Then, in Step S903, the image signal processed by the signal processing circuit 4 is converted from analog to digital by the A/D conversion circuit 5.

In Step S904, the image signal converted from analog to digital in Step S903 is stored in the memory part 6 via the memory controlling circuit 8.

Then, in Step S905, updating is performed of FAT entries of the second FAT which are recorded in the area (the sub-area 54 shown in FIG. 3) of the file data area that is not placed under management of the management data area. This updating is to update FAT entries of the second FAT which correspond to the clusters in the recording unit 7 on which the image signal stored in the memory part 6 is to be recorded.

Then, the process proceeds to Step S906, in which the image signal stored in the memory part 6 is recorded, via the memory controlling circuit 8, in a series of clusters which correspond to the FAT entries of the second FAT updated in Step S905.

Then, the process proceeds to Step S907, in which a new root directory is created and the FATs 51 and 51' of the management data area are updated. Thus, the recording processing is brought to an end.

An operation which is performed when the recording unit 7 is attached to the electronic still camera according to the present embodiment will be described below with reference to the flowchart of FIG. 13.

Figure 13:
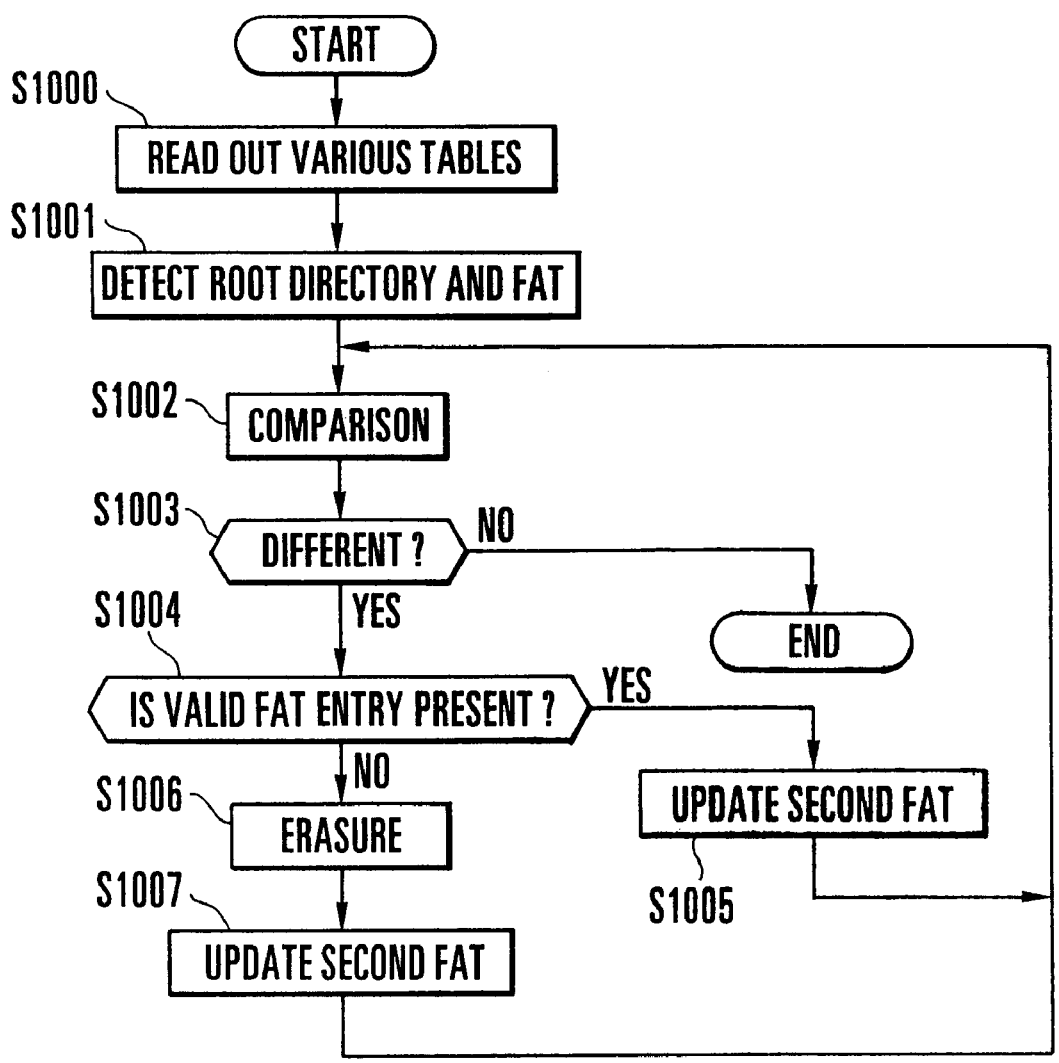
FIG. 13 is an explanatory flowchart of an erasure processing operation for the first memory 20 which is performed on the basis of the management data when the recording unit 7 according to the third embodiment is attached to the electronic still camera.

FIG. 13 is a flowchart showing a processing operation for the first memory 20 which is performed when the recording unit 7 is attached to the electronic still camera according to the present embodiment.

If the recording unit 7 is attached to the body of the electronic still camera, the flow starts. Whether the recording unit 7 has been attached is detected via the detection of the switching operation of the switch (not shown) which is turned on or off according to the attachment or removal of the recording unit 7. Such switch may be provided on the electronic still camera. It is also possible to adopt an arrangement capable of detecting the attachment of the recording unit 7 through communication between the electronic still camera and the recording unit 7.

In Step S1000, the second FAT is read from the sub-area 54 of the first memory 20 of the recording unit 7, while the root directory 52 and the FAT 51 are read from the management data area of the first memory 20 of the recording unit 7 (refer to FIG. 3). The readout results are stored in the memory part 6 or the RAM 12 of the system controlling circuit 11.

In Step S1001, the correspondence between the root directory 52 and the FAT 51 is detected. From the detected correspondence, it is determined which clusters are recording-enable clusters.

In Step S1002, the use (recording) status of the clusters detected in Step S1001 is compared with the use (recording) status of the clusters recorded on the second FAT.

If it is determined in Step S1003 that the second FAT and the correspondence (the use (recording) status of the clusters) detected in Step S1001 are equal, the initialization of the first memory 20 is brought to an end. If they differ, the process proceeds to Step S1004.

In Step S1004, it is determined whether there is a valid FAT entry which is used as part or the whole of a file absent on the second FAT (a FAT entry which constitutes part or the whole of a deleted file is not a valid FAT entry).

If there is such valid FAT entry (for example, a file is created by another data recording apparatus), the process proceeds to Step S1005, in which the data on the second FAT that corresponds to the valid FAT entry is updated. Then, the process returns to Step S1002.

If it is determined in Step S1004 that there is no such valid FAT entry, i.e., there is an invalid FAT entry which is used as part or the whole of a file present on the second FAT (i.e., a FAT entry which constitutes part or the whole of a deleted file) (for example, the file present may be deleted by another data recording apparatus), the process proceeds to Step S1006, in which a cluster corresponding to the invalid FAT entry in the second FAT is erased.

Then, the process proceeds to Step S1007 to update the second FAT, and returns to Step S1002.

The phrase "erasure of the root directory and the FAT" and other similar expressions which are used in the description of the above flowchart indicate that a predetermined value, such as "0", is recorded on at least one of the root directory and the FAT entry. The phrase "erasure of clusters" indicates that all data in a predetermined area of the recording unit 7 are fixed to "1" or "0", i.e., the predetermined area of the first memory 20 is physically erased.

If desired data is already erased or there is a particular area which does not need to be erased, the aforesaid erasure, of course, is not needed.

Incidentally, although in the third embodiment the second FAT is recorded in the area (the sub-area 54 shown in FIG. 3) of the file data area that is not placed under management of the management data area, the second FAT may be recorded in the second memory 21.

In addition, although in the third embodiment the second FAT is recorded in the area (the sub-area 54 shown in FIG. 3) of the file data area that is not placed under management of the management data area, a second root directory identical to the root directory 52 recorded in the management data area may be prepared so that both the root directory 52 and the second root directory can be used to perform the aforesaid file management.

During formatting of the recording unit 7, the second FAT and the second root directory are created.

Fourth Embodiment

The construction of an electronic still camera according to the fourth embodiment is identical to that shown in FIG. 1 which is described previously in connection with the first embodiment, and the description thereof is omitted.

The fourth embodiment differs from the first embodiment in respect of a method for recording image data in the recording unit 7.

In the fourth embodiment, there is no sub-area in the first memory 20. Instead, not only valid FAT entries but also predetermined values which are not used as the values of FAT entries are recorded in the FATs 51 and 51'.

Incidentally, the valid FAT entries indicate individual clusters on each of which valid data is recorded.

A photographic operation of the electronic still camera arranged in the above-described manner will be described below with reference to the flowchart of FIG. 14.

Figure 14:
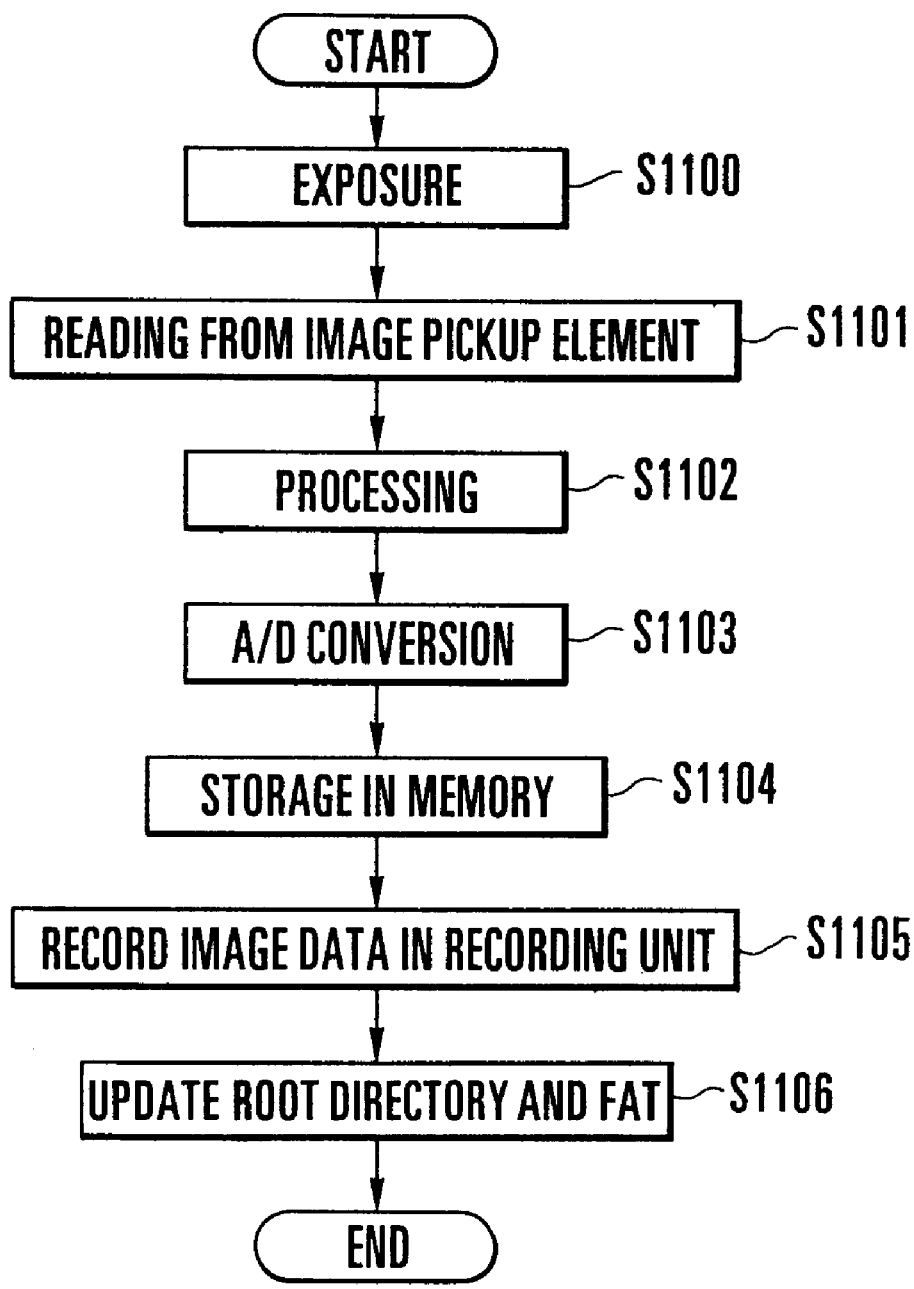
FIG. 14 is a flowchart of a photographic operation of a fourth embodiment.

FIG. 14 is an explanatory flowchart of a processing operation which is performed from the start of photography until the end of recording by the electronic still camera arranged to record image data on the first memory 20 having the above-described recording area.

If a recording instruction is inputted to the system controlling circuit 11 through the operating switch (not shown) or the like, the flow starts.

In Step S1100, the shutter 2 is driven to execute exposure. Then, in Step S1101, an image signal is read from the image pickup element 3, and the process proceeds to Step S1102.

In Step S1102, the read image signal is subjected to color correction and predetermined processing in the signal processing circuit 4.

Then, in Step S1103, the image signal processed by the signal processing circuit 4 is converted from analog to digital by the A/D conversion circuit 5.

In Step S1104, the image signal converted from analog to digital in Step S1103 is stored in the memory part 6 via the memory controlling circuit 8.

Then, in Step S1105, the image signal stored in the memory part 6 is recorded, via the memory controlling circuit 8, in the recording unit 7.

Then, the process proceeds to Step S1106, in which a new root directory corresponding to the clusters of the first memory 20 which has been used in the recording processing of Step S1105 is created and the FATs 51 and 51' of the management data area are updated. Thus, the recording processing is brought to an end.

An operation which is performed when the recording unit 7 is attached to the electronic still camera according to the present embodiment will be described below with reference to the flowchart of FIG. 15.

FIG. 15 is an explanatory flowchart of a processing operation for the first memory 20 which is performed when the recording unit 7 according to the fourth embodiment is attached to the electronic still camera.

If the recording unit 7 is attached to the body of the electronic still camera, the flow starts. Whether the recording unit 7 has been attached is detected via the detection of the switching operation of the switch (not shown) which is turned on or off according to the attachment or removal of the recording unit 7. Such switch may be provided on the electronic still camera. It is also possible to adopt an arrangement capable of detecting the attachment of the recording unit 7 through communication between the electronic still camera and the recording unit 7.

In Step S1200, the root directory 52 and the FAT 51 are read from the management data area of the recording unit 7 (refer to FIG. 3). The readout results are stored in the memory part 6 or the RAM 12 of the system controlling circuit 11.

In Step S1201, the correspondence between the root directory 52 and the FAT 51 is detected. From the detected correspondence, valid FAT entries are detected (a FAT entry which constitutes part or the whole of a deleted file is not a valid FAT entry).

In Step S1202, the values of FAT entries other than the valid FAT entries detected in Step S1101 are compared with the aforesaid predetermined value.

In Step S1203, it is determined whether all the FAT entries other than the valid FAT entries are equal to the predetermined value.

If all the FAT entries are equal to the predetermined value, the initialization of the first memory 20 is brought to an end.

If they differ, the process proceeds to Step S1204 in which clusters corresponding to the FAT entries which are not equal to the predetermined value are erased.

Then, the process proceeds to Step S1205 to change the values of the FAT entries corresponding to the erased clusters into the aforesaid predetermined value, and returns to Step S1202.

The phrase "erasure" and other similar expressions which are used in the description of the above flowchart indicate that all data in a required area of the recording unit 7 are fixed to "1" or "0", i.e., the required area of the first memory 20 is physically erased.

If desired data is already erased or there is a particular area which does not need to be erased, the aforesaid erasure, of course, is not needed.

If the recording unit 7 which is not yet used is attached to the electronic still camera according to the present embodiment, the above-described processing is performed so that the entire file data area is erased and the FATs 51 and 51' are filled with the predetermined values.

Incidentally, it is possible to practice the present invention in various other forms without departing from the spirit and primary features thereof.

Although the description of the present embodiments has referred to the electronic still cameras by way of example, the present invention is not limited to such examples.

In other words, the foregoing description of the embodiments has been given for illustrative purposes only and is not to be construed as imposing any limitation in every respect.

The scope of the invention is, therefore, to be determined solely by the following claims and not limited by the text of the specification, and alterations made within a scope equivalent to the scope of the claims fall within the true spirit and scope of the invention.

What is claimed is:

1. An electronic camera which operates with a battery power source, comprising:
   a) image pickup means for converting optical information into image data;
   b) compressing means for compressing the image data, said compressing means having a plurality of compression modes, wherein the plurality of compression modes differ in the rate of compression mutually;
   c) recording means for recording the compressed image data on a recording medium which needs to be subjected to an image data erasing operation before data is recorded on the recording medium; and
   d) erasing means for physically erasing image data from a logically erased area of the recording medium;
   e) control means for causing said erasing means to physically erase the image data from a logically erased area of the recording medium after the image data has been stored in said memory means if a physically erased area to record the image data is not present in the recording medium,
   the data amount of the logically erased area to be erased by said erasing means is adaptively varied according to a voltage of said battery source.

2. The electronic camera according to claim 1, wherein the recording medium is removably attached to the electronic camera.

3. The electronic camera according to claim 1, further comprising memory means for storing data indicative of an erased area of the recording medium.

4. The electronic camera according to claim 1, wherein the recording medium is a flash memory.

5. The electronic camera according to claim 1, wherein the recording medium is an electrically erasable programmable read-only memory.

6. The electronic camera according to claim 1, wherein the recording medium is a magnetic-optical disk.

7. The electronic camera according to claim 1, further comprising compression means for compressing the image data.

8. An image processing method comprising:
   a) an image pickup step of converting optical information into image data;
   b) a compressing step of compressing the image data, said compressing step having a plurality of compression modes, wherein the plurality of compression modes differ in the rate of compression mutually;
   c) a recording step of recording the image data on a recording medium which needs to be subjected to an image data erasing operation before data is recorded on the recording medium;

d) an erasing step of physically erasing image data from a logically erased area of the recording medium; and e) a control step of causing said erasing step to physically erase the image data from a logically erased area of the recording medium after the image data has been stored in said memory means if a physically erased area to record the image data is not present in the recording medium, the data amount of the logically erased area to be erased by said erasing step is adaptively varied according to the voltage of a battery source.

9. The method according to claim 8, further comprising a second storing step of storing data indicative of an erased area of the recording medium.

10. The method according to claim 8, wherein the recording medium is a flash memory.

11. The method according to claim 8, wherein the recording medium is an electrically erasable programmable read-only memory.

12. The method according to claim 8, wherein the recording medium is a magnetic-optical disk.

* * * * *